(12) United States Patent
Aude (10) Patent No.: US 6,833,760 B1
(45) Date of Patent: Dec. 21, 2004

(54) LOW POWER DIFFERENTIAL AMPLIFIER POWERED BY MULTIPLE UNEQUAL POWER SUPPLY VOLTAGES

(75) Inventor: Arlo Aude, Fulton, GA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/614,321

(22) Filed: Jul. 7, 2003

(51) Int. Cl.[7] .............................................. H03F 3/45
(52) U.S. Cl. ..................................... 330/297; 330/261
(58) Field of Search ................................ 330/252, 253, 330/255, 261, 297, 258, 259

(56) References Cited

U.S. PATENT DOCUMENTS 4,571,554 A * 2/1986 Martin et al. ............... 330/252
6,323,729 B1 * 11/2001 Sevenhans et al. ........... 330/51
6,664,857 B2 * 12/2003 Ausserlechner ............. 330/297

* cited by examiner

Primary Examiner—Steven J. Mottola
(74) Attorney, Agent, or Firm—Vedder Price Kaufman & Kammholz, P.C.

(57) ABSTRACT

A low power differential amplifier powered by a plurality of unequal power supply voltages. The input stage operates at a higher power supply voltage so as to maintain its transistors in operational states of saturation while providing a sufficient dynamic signal voltage range. The output stage operates at a lower power supply voltage while providing a sufficient dynamic signal current range.

17 Claims, 5 Drawing Sheets

LOW POWER DIFFERENTIAL AMPLIFIER POWERED BY MULTIPLE UNEQUAL POWER SUPPLY VOLTAGES

BACKGROUND OF THE INVENTION

1. Field of the Invention

The present invention relates to differential amplifiers, and in particular, to differential amplifiers operating in a low power circuit environment.

2. Description of the Related Art

Figure 1A:
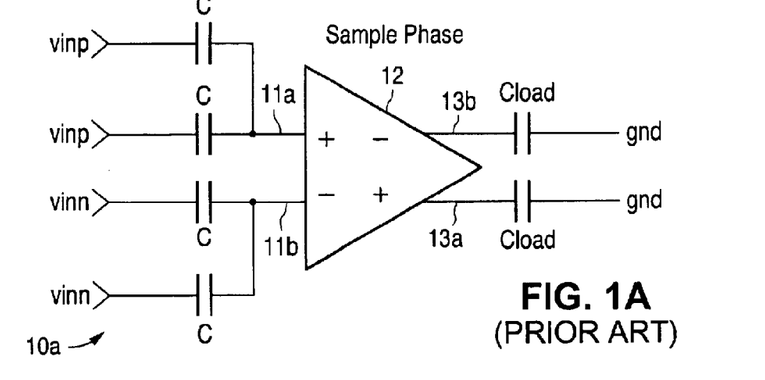
FIGS. 1A and 1B are circuit schematic diagrams of the sample and hold phases of a conventional switched capacitor circuit.
Figure 1B:
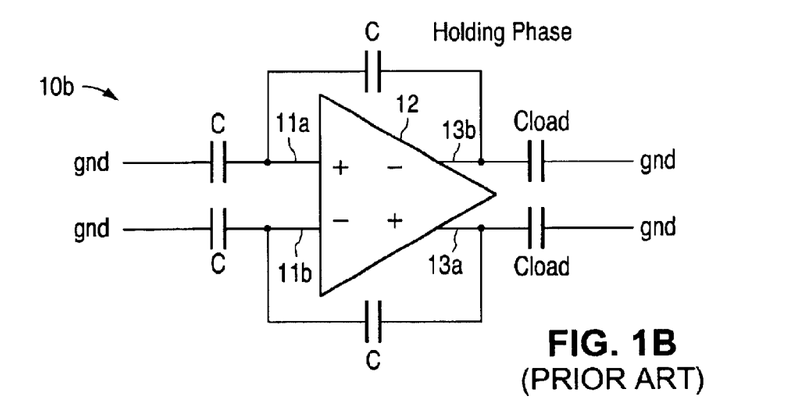

Referring to FIGS. 1A and 1B, switched capacitor circuits are well known in the art. Such circuits can be used to provide various signal filtering or integration functions and typically have two phases, or states, of operation: a sample phase Oa and a holding phase 10b. As is well known in the art, switches (not shown) driven by nonoverlapping clock signal phases (not shown) cause input and feedback capacitances coupled to the input terminals 11a, 11b of the differential amplifier 12, to switch between reception of the positive Vinp and negative Vinn phases of the differential input signal Vin, and circuit ground GND, thereby feeding back the positive Voutp 13a and negative Voutn 13b signal phases of the output signal Vout. Load capacitances Cload couple the output signal terminals 13a, 13b, to circuit ground GND.

As is further well known, modern complementary metal oxide semiconductor (CMOS) processes are continuing to scale down in terms of power supply voltage magnitudes. Indeed, some circuits are now expected to operate at power supply voltages at or below one volt. Particularly for the amplifier 12 in a switched capacitor circuit, such low power supply voltages result in lost headroom for the analog amplifier circuitry.

Figure 2:
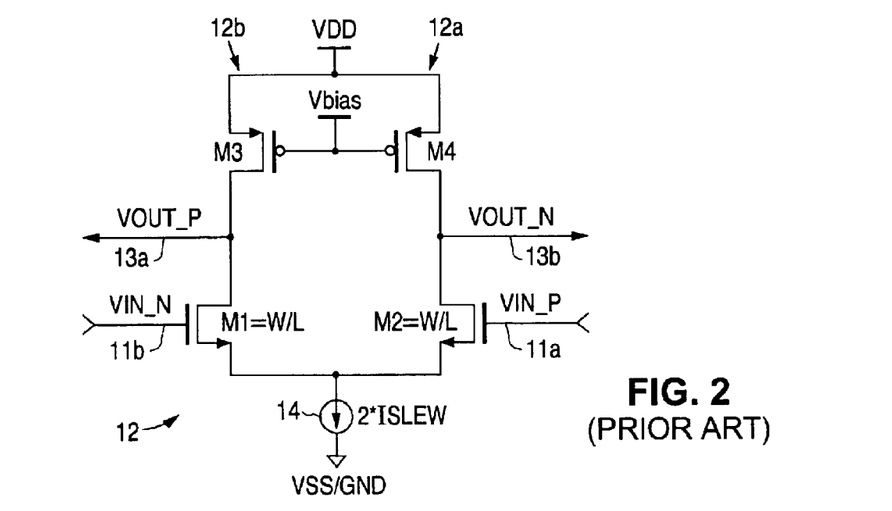
FIG. 2 is a schematic diagram of a conventional differential amplifier circuit.

Referring to FIG. 2, a typical implementation of the differential amplifier 12 includes two circuit branches 12a, 12b formed by the serial connections of transistors M2 and M4 and transistors M1 and M3, powered by a power supply voltage VDD and driven by a tail current source 14, which together produce a total amplifier bias current of 2*Islew. When used in the switched capacitor circuit 10, the overall circuitry has one pole at a dominant pole position, and a feedback factor associated with the switched capacitors C. (It should be understood that this simplified analysis ignores the input capacitance of the differential amplifier circuit 12.)

At low power supply VDD voltages, it is difficult to maintain the transistors M1, M2, M3, M4 of the amplifier 12 in their respective operational states of saturation. This difficulty increases significantly when cascode devices are added to the P-MOS and N-MOS portions of the circuit 12. Accordingly, high DC gain cannot be achieved. Moreover, simply increasing the power supply voltage VDD to improve headroom will significantly increase power dissipation of the circuit 12.

Figure 3:
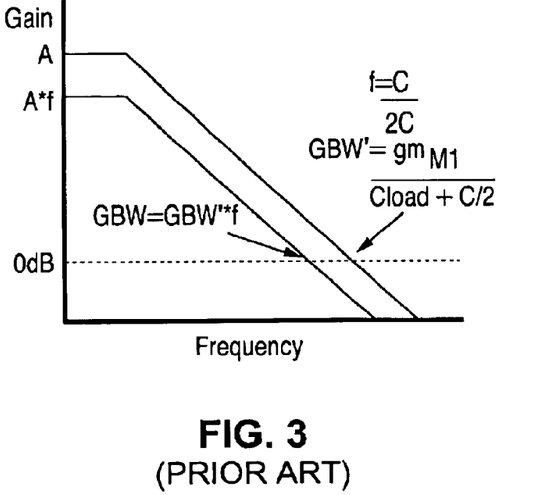
FIG. 3 is a graph depicting the gain versus frequency characteristic of the circuit of FIG. 2 when used in the circuit of FIGS. 1A and 1B.

Referring to FIG. 3, the aforementioned dominant pole causes the open loop gain bandwidth product GBW' for the amplifier 12 to be a function of the transconductance gm of the input transistors M1, M2 and the switched and load Cload capacitances. The feedback factor f, which is equal to 0.5 for equal valued switched capacitances C, affects the closed loop gain bandwidth product GBW accordingly (GBW=GBW'*f).

SUMMARY OF THE INVENTION

In accordance with the presently claimed invention, a low power differential amplifier is powered by a plurality of unequal power supply voltages. The input stage operates at a higher power supply voltage so as to maintain its transistors in operational states of saturation while providing a sufficient dynamic signal voltage range. The output stage operates at a lower power supply voltage while providing a sufficient dynamic signal current range.

In accordance with one embodiment of the presently claimed invention, a low power differential amplifier powered by a plurality of unequal power supply voltages includes power supply terminals, telescopic differential amplifier circuitry and voltage follower circuitry. A first power supply terminal conveys a first power supply voltage having a first voltage magnitude. A second power supply terminal conveys a second power supply voltage having a second voltage magnitude which is less than the first voltage magnitude. The telescopic differential amplifier circuitry, coupled to the first power supply terminal, responds to reception of the first power supply voltage and an input differential signal by providing an intermediate differential signal corresponding to the input differential signal. The voltage follower circuitry, coupled to the second power supply terminal and the telescopic differential amplifier circuitry, responds to reception of the second power supply voltage and the intermediate differential signal by providing an output differential signal corresponding to the intermediate differential signal.

In accordance with another embodiment of the presently claimed invention, a low power differential amplifier powered by a plurality of unequal power supply voltages includes power means, differential amplifier means and voltage follower means. A first power means is for conveying a first power supply voltage having a first voltage magnitude. A second power means is for conveying a second power supply voltage having a second voltage magnitude which is less than the first voltage magnitude. The differential amplifier means is for receiving the first power supply voltage and an input differential signal and responding thereto by generating an intermediate differential signal corresponding to the input differential signal. The voltage follower means is for receiving the second power supply voltage and the intermediate differential signal and responding thereto by generating an output differential signal corresponding to the intermediate differential signal.

In accordance with still another embodiment of the presently claimed invention, a low power differential amplifier powered by a plurality of unequal power supply voltages includes power supply terminals and amplifier circuitries. A first power supply terminal conveys a first power supply voltage having a first voltage magnitude and a first power supply current having a first current magnitude. A second power supply terminal conveys a second power supply voltage having a second voltage magnitude and a second power supply current having a second current magnitude, wherein the first voltage magnitude is greater than the second voltage magnitude and the first current magnitude is less than the second current magnitude. First amplifier circuitry, coupled to the first power supply terminal, responds to reception of the first power supply voltage, the first power supply current and an input differential signal by providing an intermediate differential signal corresponding to the input differential signal. Second amplifier circuitry, coupled to the second power supply terminal and the first amplifier circuitry, responds to reception of the second power supply voltage, the second power supply current and the intermediate differential signal by providing an output differential signal corresponding to the intermediate differential signal.

In accordance with yet another embodiment of the presently claimed invention, a low power differential amplifier powered by a plurality of unequal power supply voltages includes power means and amplifier means. A first power means is for conveying a first power supply voltage having a first voltage magnitude and a first power supply current having a first current magnitude. A second power means is for conveying a second power supply voltage having a second voltage magnitude and a second power supply current having a second current magnitude, wherein the first voltage magnitude is greater than the second voltage magnitude and the first current magnitude is less than the second current magnitude. A first amplifier means is for receiving the first power supply voltage, the first power supply current and an input differential signal and responding thereto by generating an intermediate differential signal corresponding to the input differential signal.

A second amplifier means is for receiving the second power supply voltage, the second power supply current and the intermediate differential signal and responding thereto by generating an output differential signal corresponding to the intermediate differential signal.

DETAILED DESCRIPTION

The following detailed description is of example embodiments of the presently claimed invention with references to the accompanying drawings. Such description is intended to be illustrative and not limiting with respect to the scope of the present invention. Such embodiments are described in sufficient detail to enable one of ordinary skill in the art to practice the subject invention, and it will be understood that other embodiments may be practiced with some variations without departing from the spirit or scope of the subject invention.

Throughout the present disclosure, absent a clear indication to the contrary from the context, it will be understood that individual circuit elements as described may be singular or plural in number. For example, the terms "circuit" and "circuitry" may include either a single component or a plurality of components, which are either active and/or passive and are connected or otherwise coupled together to provide the described function. Additionally, the term "signal" may refer to one or more currents, one or more voltages, or a data signal. Within the drawings, like or related elements will have like or related alpha, numeric or alphanumeric designators.

Further, while the following discussion is in a context of certain arrangements of N-type and P-type metal oxide semiconductor field effect transistors (e.g., N-MOSFETs M1, M2, M5 and M6, and P-MOSFETs M3, M4, M7, M8, M9 and M10, respectively) powered by a positive power supply voltage VDD (where VSS is a negative voltage or ground GND potential), it will be readily understood by one of ordinary skill in the art that corresponding circuit arrangements can be implemented in accordance with well known circuit design techniques in which the N-MOSFETs are replaced with P-MOSFETs, the P-MOSFETs are replaced with N-MOSFETs, and powered is provided by a negative power supply voltage VSS (where VDD is a positive voltage or ground GND potential).

Figure 4:
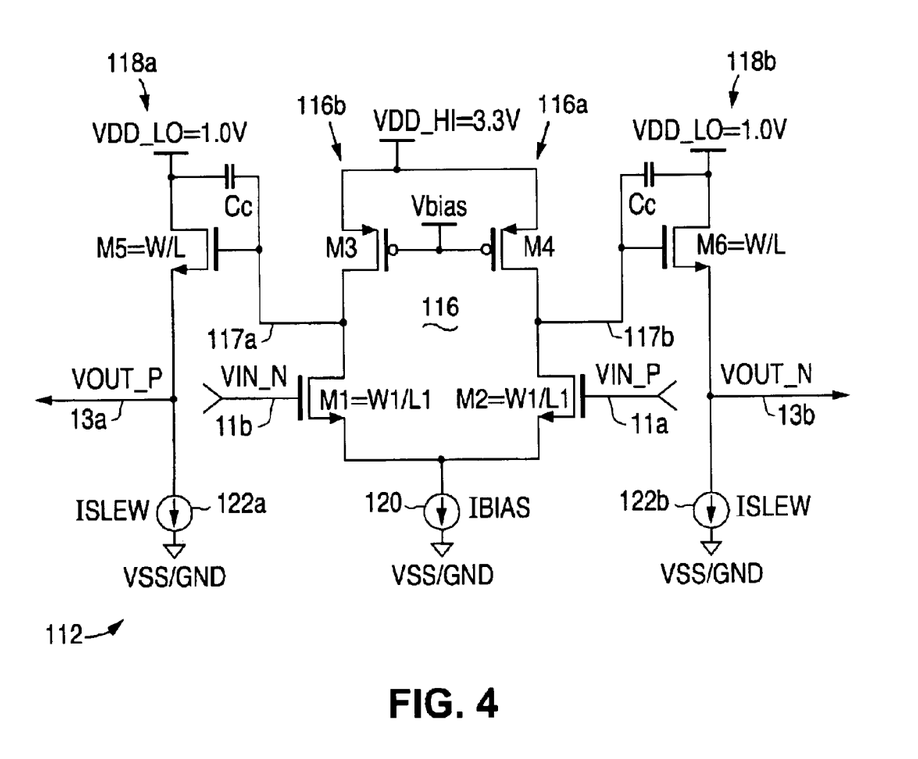
FIG. 4 is a schematic diagram of a differential amplifier circuit in accordance with one embodiment of the presently claimed invention.

Referring to FIG. 4, a differential amplifier 112 in accordance with one embodiment of the presently claimed invention is powered by multiple unequal power supply voltages. The input stage 116 includes two circuit branches 116a, 116b formed by the serial connections of transistors M2 and M4 and transistors M1 and M3, powered by the higher of the two power supply voltages VDD HI, and driven by a tail current source 120 sinking the lower of the two bias currents Ibis (discussed in more detail below). In accordance with well known circuit principles, transistors M3 and M4 serve as load devices for the input transistors M1, M2, and are biased in on states by a bias voltage Vbias.

The output stage 118 includes two output circuit branches 118a, 118b formed by the serial connections of transistor M5 and current source 122a and transistor M6 and current source 122b. Each of these circuit branches 118a, 1118b is powered by the lower of the two power supply voltages VDD LO and conducts the higher of the two power supply currents Islew which is sunk by the current sources 122a, 122b. Compensation capacitances Cc coupled between the gate and drain terminals of the output transistors M5, M6 establish the open loop gain bandwidth product GBW' for the circuit 112.

Figure 5:
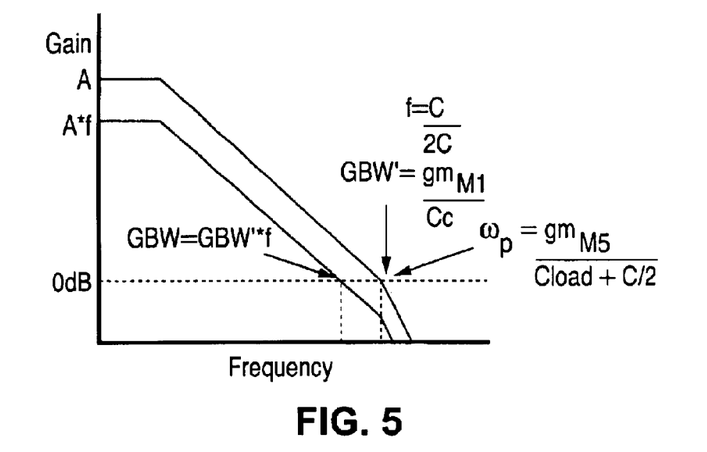
FIG. 5 is a graph of the gain versus frequency characteristic of the circuit of FIG. 4 when used in the circuit of FIGS. 1A and 1B.

Referring to FIG. 5, the differential amplifier 112 of FIG. 4, when used in the switched capacitor circuit of FIGS. 1A and 1B, can be designed to maintain the same open loop gain bandwidth product GBW' as the circuit 12 of FIG. 2, which is a function of the load Cload and switched capacitances and feedback factor f. The output stage 118 serves as a level shifting stage by nature of the voltage follower action of output transistors M5 and M6. This output stage 118 does not significantly load the input stage 116 because the gate-to-source capacitance Cgs of the output transistors M5, M6 is bootstrapped by the source follower operation of these transistors M5, M6. Accordingly, the output, or load, capacitance for the input stage 116 is small, and is primarily that of the overlap capacitance of the output transistors M5, M6 (i.e., the capacitance formed by the inherent overlap of the gate terminal and the drain and source regions of the transistor) plus the three gate-to-drain capacitances Cgd of the transistors at the output terminals 117a, 117b of the input stage 116 (i.e., transistors M1, M3 and M5 at terminal 117a, and transistors M2, M4 and M6 at terminal 117b). As a result, the input stage 116 can be biased with a very low bias current Ibias for the desired gain bandwidth product, thereby significantly reducing the power required from the power supply VDD HI. For example, since the input stage 116 can run on such a very low current, the higher power supply voltage VDD HI can be sourced by a power supply typically used for the input and output circuit functions of the host integrated circuit, or alternatively, it can be generated by any of a number of well known voltage generating techniques such as those used in charge pumps.

As is well known, a switched capacitor system, such as that depicted in FIGS. 1A and 1B, requires a minimum output current equal to the slew rate requirements. Accordingly, this current requirement determines the value of the output currents Islew driving the output transistors M5, M6. Hence, for the conventional single stage amplifier 12 (FIG. 2) the bias current was twice this amount, i.e., 2*Islew. However, in the two-stage design 112 of FIG. 4, each circuit branch 118a, 118b of the output stage is biased with such a current Islew. Since these circuit branches 118a, 118b are powered from the lower power supply voltage, the power dissipated by these circuit branches 118a, 18b is significantly lower than the power dissipated by the single stage amplifier 12. Accordingly, with a sufficient voltage difference between the higher VDD HI and lower VDD LO power supply voltages, the total power dissipated in the two stage amplifier 112 can be significantly below that of the single stage amplifier 12.

Referring to FIG. 5, when the amplifier circuit 112 of FIG. 4 is used in a switched capacitor system, such as that shown in FIGS. 1A and 1B, a pole is created in the open loop transfer function of the two-stage amplifier circuit 112 at the same frequency as for the single stage amplifier 12 (FIG. 2) before modification by the feedback factor f. The frequency of this pole is a function of the transconductance gm of the output transistors M5, M6 and the load Cload and switched capacitances of the switched capacitor network (FIGS. 1A and 1B).

As represented below, the phase margin pm can be calculated as 90 degrees minus the arctangent of frequency divided by the frequency ωp of the pole. When the feedback factor is applied, the gain bandwidth product GBW is affected, but the frequency ωp of the pole is not. Therefore, if the frequencies of the pole ωp and open loop gain bandwidth product GBW' are equal, then the quotient ω/ωp is simply equal to the feedback factor f. In the ideal case, when the feedback factor equals 0.5, the phase margin pm equals 63 degrees and the signal peaking is −0.4 decibels.

```
Phase Margin = 90 − arctan (ω/ωp)
       GBW' = ωp
Phase Margin = 90 − arctan (f)
            = 90 − arctan (C/(2C))
            = 90 − arctan (C/(2C))
            = 90 − arctan (0.5)
            = 63 degrees
     Peaking = 20 * log₁₀ (1/[sqrt((1 + cos (pm − 180))² +
              (sin (pm − 180))²)])
            = −0.4 dB
```

With peaking virtually zero, settling behavior is optimized and bandwidth is maximized. In practice, however, the feedback factor is generally larger, thereby further improving the phase margin pm. Further, since the output transistors M5, M6 are not critical in determining signal offsets or system noise, they can be biased more aggressively than the input transistors M1, M2, thereby increasing their respective transconductances gm. This further increases the frequency of the pole, thereby further improving the phase margin pm.

Figure 6:
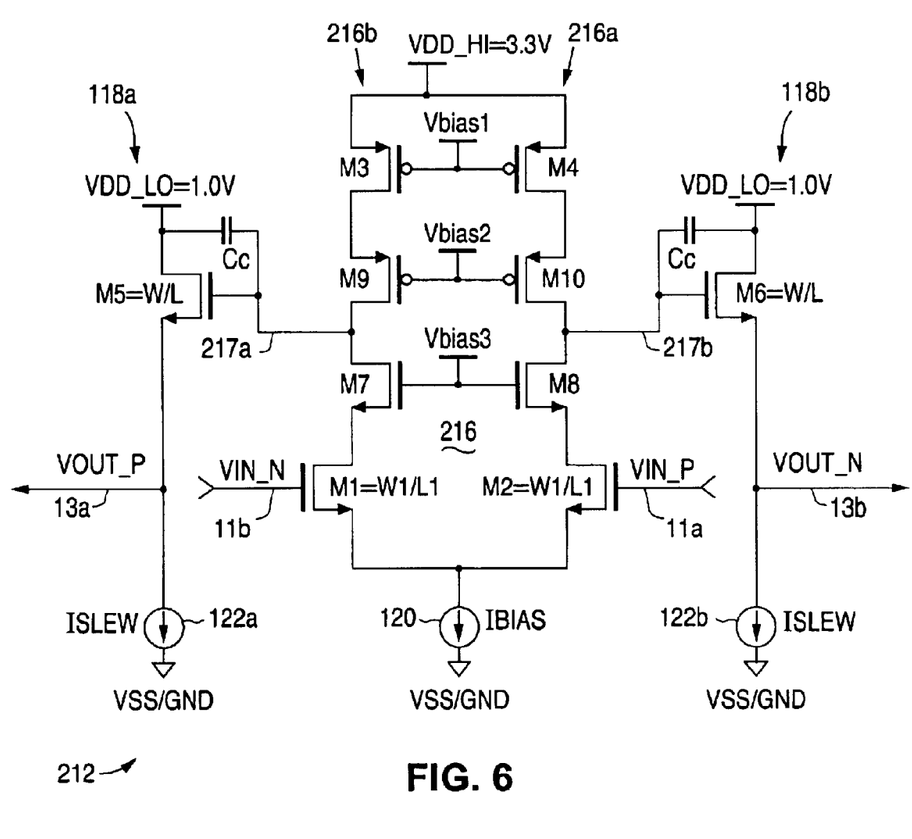
FIG. 6 is a schematic diagram of a differential amplifier circuit in accordance with another embodiment of the presently claimed invention.

Referring to FIG. 6, a differential amplifier circuit 212 in accordance with another embodiment of the presently claimed invention improves upon the circuit 112 of FIG. 4 by adding cascode transistors M7, M8, M9, M10 to increase the signal gain of the first stage 216. In a conventional switched capacitor system, such as that shown in FIGS. 1A and 1B, a feedback loop will be provided for the amplifier 12 such that the tail current source 14 (FIG. 2) is provided a control voltage (not shown) such that the common mode voltage appearing at the output terminals 13a, 13b is maintained at a desired value. However, with the two-stage amplifier design of the presently claimed invention, no such feedback loop or control is necessary.

It will be recognized that the common mode output voltage at the output terminals 217a, 217b of the input stage 216 will be equal to the common mode output voltage at the output terminals 13a, 13b of the output stage 118 plus one gate-to-source voltage Vgs of the output transistors M5, M6. Depending upon the magnitude of the power supply voltage VDD HI powering the input stage 216, this common mode output voltage of the input stage 216 may be too high or too low as compared to the desired headroom for the transistors forming the input stage 216.

Figure 7:
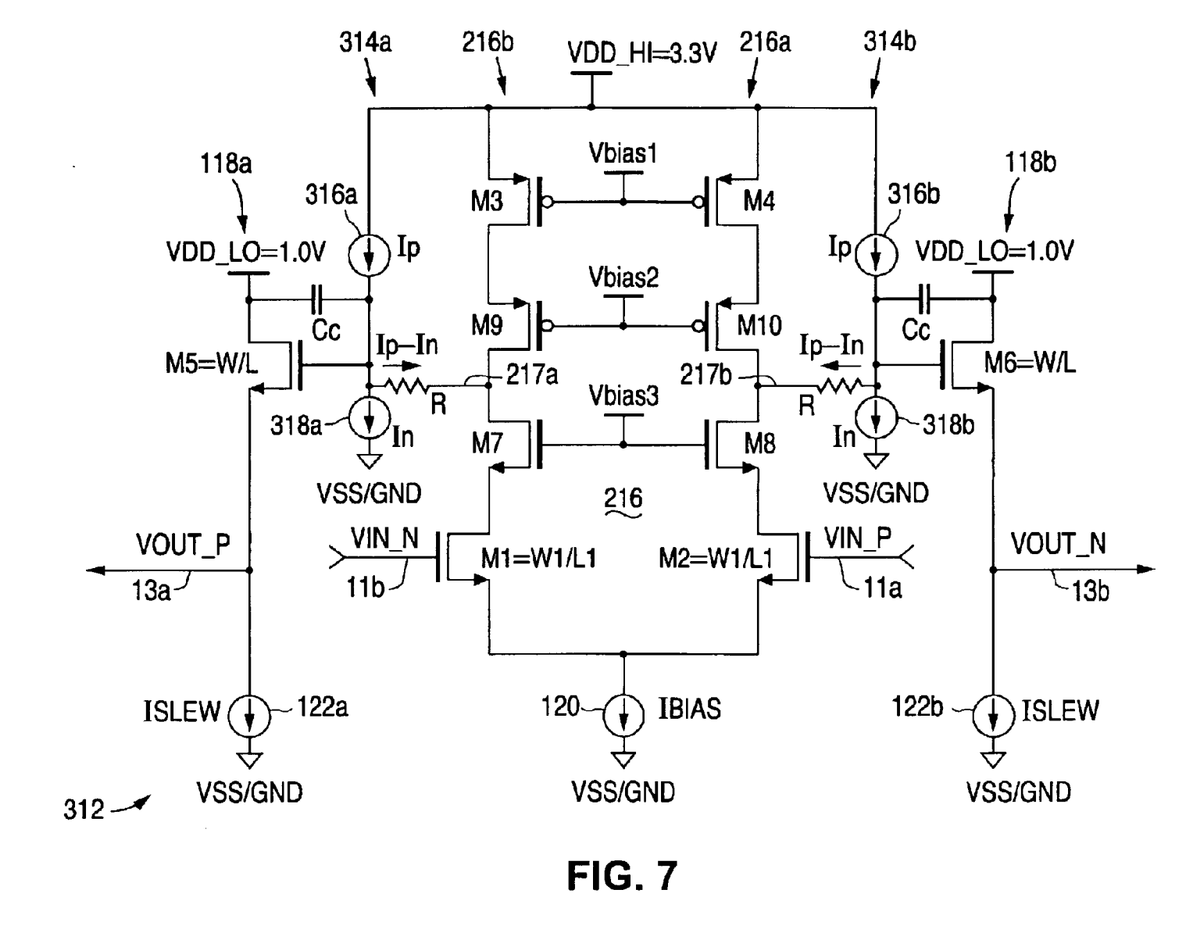
FIG. 7 is a schematic diagram of a differential amplifier circuit in accordance with still another embodiment of the presently claimed invention.

Referring to FIG. 7, a differential amplifier circuit 312 in accordance with still another embodiment of the presently claimed invention includes additional bias circuitry 314 to modify, e.g., equalize, the common mode output voltages at the output terminals 217a, 217b of the input stage 216 and the output terminals 13a, 13b of the output stage 118. This bias circuitry 314 includes two circuit branches 314a, 314b, each of which can include a resistor R connected in series between the input 216 and output 118 stages, plus serially connected current sourcing 316 and sinking 318 circuits between the power supply terminals VDD HI, VSS/GND, substantially as shown. Depending upon the desired amount of modification or equalization of the common mode output voltages, any one or two or all three additional circuit elements R, 316, 318 may be used to adjust the effective common mode output voltage of the first stage 216. For example, for the effective common mode output voltage of the input stage 216 to appear equal to the common mode output voltage of the output stage 118, the product of the resistance R and the difference current Ip-In will be substantially equal to the gate-to-source voltages Vgs of the output transistors M5, M6.

Figure 8:
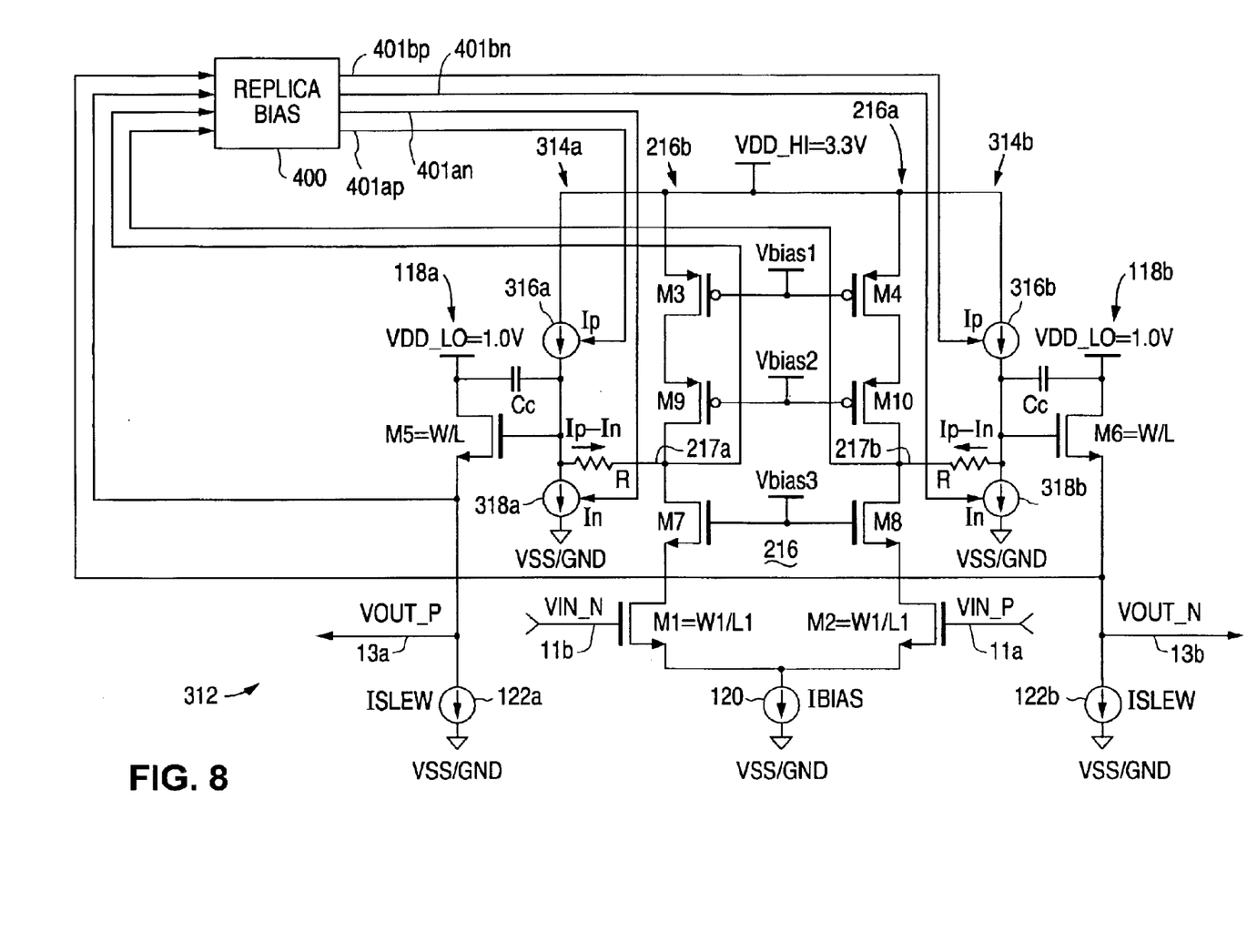
FIG. 8 is a schematic diagram of a differential amplifier circuit in accordance with yet another embodiment of the presently claimed invention.

Referring to FIG. 8, the differential amplifier circuit 312 of FIG. 7 can be controlled using a replica bias circuit 400 in accordance with well known replica biasing techniques. The common mode output voltages at the output terminals 217a, 217b, 13a, 13b of the input 216 and output 118 stages are monitored and used to provide control signals 401ap, 401an, 401bp, 401bn for the current sources 316a, 318a, 316b, 318b of the compensation circuit 314 so as to establish the desired difference current Ip-In such that the first stage 216 maintains the desired effective common mode output voltage.

While the use of this additional biasing circuitry 314 may degrade the output impedance of the first stage 216, since capacitively loaded source follower circuits generally exhibit an effectively negative input resistance at their gate terminals, with proper adjustment, the addition of a small resistance R between the input 216 and output 118 stages can improve the transient signal response overall. An upper limit of the value of the resistance R will be determined by the tolerable amount of phase response degradation caused by an additional transfer function pole that becomes more active as the product R*Cc of the resistance R and compensation capacitance Cc becomes increases.

Various other modifications and alternations in the structure and method of operation of this invention will be apparent to those skilled in the art without departing from the scope and the spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including a low power differential amplifier powered by a plurality of unequal power supply voltages, comprising:
   a first power supply terminal to convey a first power supply voltage having a first voltage magnitude;
   a second power supply terminal to convey a second power supply voltage having a second voltage magnitude which is less than said first voltage magnitude;
   telescopic differential amplifier circuitry, coupled to said first power supply terminal, that responds to reception of said first power supply voltage and an input differential signal by providing an intermediate differential signal corresponding to said input differential signal; and
   voltage follower circuitry, coupled to said second power supply terminal and said telescopic differential amplifier circuitry, that responds to reception of said second power supply voltage and said intermediate differential signal by providing an output differential signal corresponding to said intermediate differential signal.

2. The apparatus of claim 1, wherein said telescopic differential amplifier circuitry comprises:
   a first circuit branch including a first signal transistor and a first bias transistor coupled in series that responds to said first power supply voltage by conveying a portion of a predetermined current;
   a second circuit branch including a second signal transistor and a second bias transistor coupled in series that responds to said first power supply voltage by conveying another portion or said predetermined current; and
   current source circuitry, coupled to said first and second circuit branches, that responds to said first power supply voltage by conveying said predetermined current.

3. The apparatus of claim 1, wherein said voltage follower circuitry comprises:
   a first transistor that responds to said second power supply voltage by conveying a first predetermined current;
   first current source circuitry, coupled to said first transistor, that responds to said second power supply voltage by conveying said first predetermined current,
   a second transistor that responds to said second power supply voltage by conveying a second predetermined current; and
   second current source circuitry, coupled to said second transistor, that responds to said second power supply voltage by conveying said second predetermined current.

4. The apparatus of claim 3, wherein said first and second predetermined currents are substantially equal.

5. The apparatus of claim 1, wherein
   said telescopic differential amplifier circuitry, responsive to said first power supply voltage, bas a first common mode output voltage associated therewith;
   said voltage follower circuitry, responsive to said second power supply voltage, has a second common mode output voltage associated therewith; and
   said first and second common mode output voltages differ by a predetermined amount.

6. The apparatus of claim 5, wherein said low power differential amplifier further comprises bias circuitry, coupled to said telescopic differential amplifier circuitry and said voltage follower circuitry, that responds to reception of said first and second common mode output voltages by providing at least one bias signal such that said predetermined amount is approximately zero.

7. The apparatus of claim 1, wherein:
   said first power supply terminal is further to convey a first power supply current having a first current magnitude;
   said second power supply terminal is further to convey a second power supply current having a second current magnitude, wherein said first current magnitude is less than said second current magnitude;
   said telescopic differential amplifier circuitry responds to reception of said first power supply voltage, said first power supply current and said input differential signal by providing said intermediate differential signal; and
   said voltage follower circuitry responds to reception of said second power supply voltage, said second power supply current and said intermediate differential signal by providing said output differential signal.

8. The apparatus of claim 7, wherein:
   said telescopic differential amplifier circuitry, responsive to said first power supply voltage, has a first common mode output voltage associated therewith;
   said voltage follower circuitry, responsive to said second power supply voltage, has a second common mode output voltage associated therewith; and
   said first and second common mode output voltages differ by a predetermined amount.

9. An apparatus including a low power differential amplifier powered by a plurality of unequal power supply voltages, comprising:
   first power means for conveying a first power supply voltage having a first voltage magnitude;
   second power means for conveying a second power supply voltage having a second voltage magnitude which is less than said first voltage magnitude;
   differential amplifier means for receiving said first power supply voltage and an input differential and responding thereto by generating an intermediate differential signal corresponding to said input differential signal; and
   voltage follower means for receiving said second power supply voltage and said intermediate differential signal and responding thereto by generating an output differential signal corresponding to said intermediate differential signal.

10. The apparatus of claim 9, wherein
    said differential amplifier means is first for receiving said first power supply voltage and responding thereto by generating a first common mode output voltage;
    said voltage follower means is further for receiving said second power supply voltage and responding thereto by generating a second common mode output voltage; and
    said low power differential amplifier further comprises biasing means for receiving said first and second common mode output voltages and responding thereto by generating at least one bias signal such that said first and second common mode output voltages are substantially equal.

11. An apparatus including a low power differential amplifier powered by a plurality of unequal power supply voltages, comprising:

a first power supply terminal to convey a first power supply voltage having a first voltage magnitude and a first power supply current having a first current magnitude;

a second power supply terminal to convey a second power supply voltage having a second voltage magnitude and a second power supply current having a second current magnitude, wherein said first voltage magnitude is greater than said second voltage magnitude and said first current magnitude is less than said second current magnitude;

first amplifier circuitry, coupled to said first power supply terminal, that responds to reception of said first power supply voltage, said first power supply current and an input differential signal by providing an intermediate differential signal corresponding to said input differential signal, and includes
 a first circuit branch that responds to said first power supply voltage by conveying a portion of a predetermined current,
 a second circuit branch that responds to said first power supply voltage by conveying another portion of said predetermined current, and
 current source circuitry, coupled to said first and second circuit branches, that responds to said first power supply voltage by conveying said predetermined current; and second amplifier circuitry, coupled to said second power supply terminal and said first amplifier circuitry, that responds to reception of said second power supply voltage, said second power supply current and said intermediate differential signal by providing an output differential signal corresponding to said intermediate differential signal.

12. An apparatus including a low power differential amplifier powered by a plurality of unequal power supply voltages, comprising:
 a first power supply terminal to convey a first power supply voltage having a first voltage magnitude and a first power supply current having a first current magnitude;
 a second power supply terminal to convey a second power supply voltage having a second voltage magnitude and a second power supply current having a second current magnitude, wherein said first voltage magnitude is greater than said second voltage magnitude and said first current magnitude is less than said second current magnitude;
 first amplifier circuitry, coupled to said first power supply terminal, that responds to reception of said first power supply voltage, said first power supply current and an input differential signal by providing an intermediate differential signal corresponding to said input differential signal; and
 second amplifier circuitry, coupled to said second power supply terminal and said first amplifier circuitry, that responds to reception of said second power supply voltage, said second power supply current ard said intermediate differential signal by providing an output differential signal corresponding to said intermediate differential signal, and includes
  a first transistor that responds to said second power supply voltage by conveying a first predetermined current,
  first current source circuitry, coupled to said first transistor, that responds to said second power supply voltage by conveying said first predetermined current,
  a second transistor that responds to said second power supply voltage by conveying a second predetermined current, and
  second current source circuitry, coupled to said second transistor, that responds to said second power supply voltage by conveying said second predetermined current.

13. The apparatus of claim 12, wherein said first and second predetermined currents are substantially equal.

14. An apparatus including a low power differential amplifier powered by a plurality of unequal power supply voltages, comprising:
 a first power supply terminal to convey a first power supply voltage having first voltage magnitude and a first power supply current having a first current magnitude;
 a second power supply terminal to convey a second power supply voltage having a second voltage magnitude and a second cower supply current having a second current magnitude, wherein said first voltage magnitude is greater than said second voltage magnitude and said first current magnitude is less than said second current magnitude;
 first amplifier circuitry, coupled to said first power supply terminal, that responds to reception of said first power supply voltage, said first power supply current and an input differential signal by providing an intermediate differential signal corresponding to said input differential signal; and
 second amplifier circuitry, coupled to said second power supply terminal and said first amplifier circuitry, that responds to reception of said second power supply voltage, said second power supply current mid said intermediate differential signal by providing an output differential signal corresponding to said intermediate differential signal;
 wherein
  said intermediate differential signal has an intermediate signal magnitude,
  said output differential signal has an output signal magnitude, and
  said intermediate and output signal magnitudes are substantially equal.

15. An apparatus including a low power differential amplifier powered by a plurality of unequal power supply voltages, comprising:
 a first power supply terminal to convey a first power supply voltage having a first voltage magnitude and a first power supply current having first current magnitude;
 a second power supply terminal to convey a second power supply voltage having a second voltage magnitude and a second power supply current having a second current magnitude, wherein said first voltage magnitude is greater than said second voltage magnitude and said first current magnitude is less than said second current magnitude;
 first amplifier circuitry coupled to said first power supply terminal, that responds to reception of said first power supply voltage, said first power supply current and an input differential signal providing an intermediate differential signal corresponding to said input differential signal: and
 second amplifier circuitry, coupled to said second power supply terminal and said first amplifier circuitry, that responds to reception of said second power supply voltage, said second power supply current and said intermediate differential signal by providing an output differential, signal corresponding to aid intermediate differential signal;

wherein said first amplifier circuitry, responsive to said first power supply voltage, has a first common mode output voltage associated therewith, said second amplifier circuitry, responsive to said second power supply voltage, has a second common inode output voltage associated therewith, and said first and second common mode output voltages differ by a predetermined amount.

16. The apparatus of claim 15, wherein said low power differential amplifier further comprises bias circuitry, coupled to said first amplifier circuitry and said second amplifier circuitry, that responds to reception of said first and second common mode output voltages by providing at least one bias signal such that said predetermined amount is approximately zero.

17. An apparatus including a low power differential amplifier powered by a plurality of unequal power supply voltages, comprising:

first power means for conveying a first power supply voltage having a first voltage magnitude and a first power supply current having a first current magnitude;

second power means for conveying a second power supply voltage having a second voltage magnitude and a second power supply current having a second current magnitude, where said first voltage magnitude is greater than said second voltage magnitude and said first current magnitude is less than said second current magnitude;

first amplifier means for receiving said fist power supply voltage, said first power supply current and an input differential signal and responding thereto by generating an intermediate differential signal corresponding to said input differential signal, and further for receiving said first power supply voltage and responding thereto by generating a first common mode output voltage;

second amplifier means for receiving said second power supply voltage, said power supply current and said intermediate differential signal and responding thereto by generating an output differential signal corresponding to said intermediate differential signal, and further for receiving said second power supply voltage and responding thereto by generating a second common mode output voltage; and biasing means for receiving said first and second common mode output voltages and responding thereto by generating at least one bias signal such that said first and second common mode output voltages are substantially equal.

\* \* \* \* \*

UNITED STATES PATENT AND TRADEMARK OFFICE
CERTIFICATE OF CORRECTION

PATENT NO.   : 6,833,760 B1
DATED        : December 21, 2004
INVENTOR(S)  : Arlo Aude It is certified that error appears in the above-identified patent and that said Letters Patent is hereby corrected as shown below:

Column 1,
Line 16, delete "Oa" and replace with -- 10a --.
Line 19, after "tances" and before "coupled", please insert -- C --.
Line 43, after "factor" and before "associated", please insert -- f --.
Line 58, after "switched" and before "and", please insert -- C --.

Column 4,
Line 28, delete "Ibis" and replace with -- Ibias --.
Line 36, delete "1118" and replace with -- 118b --.
Line 48, after "switched" and before "capacitances", please insert -- C --.

Column 5,
Line 18, delete "18b" and replace with -- 118b --.
Line 36, after "frequency", please insert -- ho --.
Line 38, after "factor" and before "is", please insert -- f --.
Line 40, delete "cop" and insert -- ωp --.
Line 59, after "factor" and before "is , please insert -- f --.

Column 7,
Line 63, delete "bas" and insert -- has --.

Column 8,
Line 53, delete "first" and insert -- further --.

Column 9,
Line 57, delete "ard" and insert -- and --.

Column 10,
Line 19, delete "cower" and insert -- power --.
Line 33, delete "mid" and insert -- and --.
Line 49, after "having" and before "fast", please insert -- a --.
Line 58, after "circuitry", please insert -- , --.
Line 61, after "signal", please insert -- by --.
Line 63, delete ":" and insert -- ; --.

Column 11,
Line 3, delete ",".
Line 3, delete "aid" and insert -- said --.
Line 11, delete "inode" and insert -- mode --.

UNITED STATES PATENT AND TRADEMARK OFFICE
CERTIFICATE OF CORRECTION

PATENT NO. : 6,833,760 B1
DATED : December 21, 2004
INVENTOR(S) : Arlo Aude

It is certified that error appears in the above-identified patent and that said Letters Patent is hereby corrected as shown below:

Column 12,
Line 6, delete "fist" and insert -- first --.
Line 14, after "said" and before "power", please insert -- second --.

Signed and Sealed this

Nineteenth Day of April, 2005

JON W. DUDAS
*Director of the United States Patent and Trademark Office*

UNITED STATES PATENT AND TRADEMARK OFFICE
CERTIFICATE OF CORRECTION

PATENT NO. : 6,833,760 B1
DATED : December 21, 2004
INVENTOR(S) : Arlo Aude

It is certified that error appears in the above-identified patent and that said Letters Patent is hereby corrected as shown below:

Column 1,
Line 16, delete "Oa" and replace with -- 10a --.
Line 19, after "tances" and before "coupled", please insert -- C --.
Line 43, after "factor" and before "associated", please insert -- f --.
Line 58, after "switched" and before "and", please insert -- C --.

Column 4,
Line 28, delete "Ibis" and replace with -- Ibias --.
Line 36, delete "1118b" and replace with -- 118b --.
Line 48, after "switched" and before "capacitances", please insert -- C --.

Column 5,
Line 18, delete "18b" and replace with -- 118b --.
Line 36, after "frequency", please insert -- ω --.
Line 38, after "factor" and before "is", please insert -- f --.
Line 40, delete "cop" and insert -- ωp --.
Line 59, after "factor" and before "is", please insert -- f --.

Column 7,
Line 63, delete "bas" and insert -- has --.

Column 8,
Line 53, delete "first" and insert -- further --.

Column 9,
Line 57, delete "ard" and insert -- and --.

Column 10,
Line 19, delete "cower" and insert -- power --.
Line 33, delete "mid" and insert -- and --.
Line 49, after "having" and before "first", please insert -- a --.
Line 58, after "circuitry", please insert -- , --.
Line 61, after "signal", please insert -- by --.
Line 63, delete ":" and insert -- ; --.

Column 11,
Line 3, delete ",".
Line 3, delete "aid" and insert -- said --.
Line 11, delete "inode" and insert -- mode --.

UNITED STATES PATENT AND TRADEMARK OFFICE
CERTIFICATE OF CORRECTION

PATENT NO. : 6,833,760 B1
DATED : December 21, 2004
INVENTOR(S) : Arlo Aude

It is certified that error appears in the above-identified patent and that said Letters Patent is hereby corrected as shown below:

<u>Column 12,</u>
Line 6, delete "fist" and insert -- first --.
Line 14, after "said" and before "power", please insert -- second --.

This certificate supersedes Certificate of Correction April 19, 2005.

Signed and Sealed this

Fifth Day of July, 2005

JON W. DUDAS
*Director of the United States Patent and Trademark Office*